(12) United States Patent  
Takami (10) Patent No.: US 7,292,320 B2
(45) Date of Patent: *Nov. 6, 2007

(54) LASER CRYSTALLIZATION APPARATUS AND LASER CRYSTALLIZATION METHOD

(75) Inventor: Yoshio Takami, Yokohama (JP)

(73) Assignee: Advanced LCD Technologies Development Center Co., Ltd., Yokohama (JP)

( * ) Notice: Subject to any disclaimer, the term of this patent is extended or adjusted under 35 U.S.C. 154(b) by 248 days.

This patent is subject to a terminal disclaimer.

(21) Appl. No.: 11/074,054

(22) Filed: Mar. 8, 2005

(65) Prior Publication Data

US 2005/0199596 A1    Sep. 15, 2005

(30) Foreign Application Priority Data

Mar. 11, 2004  (JP)  ............................. 2004-069470
Dec. 3, 2004   (JP)  ............................. 2004-351734

(51) Int. Cl.
*G01N 21/00* (2006.01)

(52) U.S. Cl. ........................................ 356/30
(58) Field of Classification Search ................. 356/30, 356/601–640; 250/208.1, 200; 219/121.65; 438/457
See application file for complete search history.

(56) References Cited

U.S. PATENT DOCUMENTS

| | | | | |
|---|---|---|---|---|
| 4,327,285  | A  | * | 4/1982  | Bradley ................ 250/214 VT |
| 2002/0145733 | A1 | * | 10/2002 | Wada et al. ............ 356/237.2 |
| 2003/0017658 | A1 | * | 1/2003  | Nishitani et al. ........... 438/149 |
| 2003/0196993 | A1 | * | 10/2003 | Jennings .................. 219/121.8 |
| 2004/0266080 | A1 | * | 12/2004 | Jyomonji et al. ........... 438/166 |

(Continued)

FOREIGN PATENT DOCUMENTS

CN    1487577 A    4/2004

(Continued)

OTHER PUBLICATIONS

Kohki Inoue et al., "Amplitude and Phase Modulated Excimer-Laser Melt-Regrowth Method of Silicon Thin-Films-A New Growth Method of 2-D Position-Controlled Large-Grains-", a thesis journal of Institute of Electronics, Information and Communication Engineers, vol. J85-C, No. 8, 2002, pp. 624-629.

(Continued)

*Primary Examiner*—Tarifur Chowdhury
*Assistant Examiner*—Tara S Pajoohi
(74) *Attorney, Agent, or Firm*—Oblon, Spivak, McClelland, Maier & Neustadt, P.C.

(57) ABSTRACT

A laser crystallization apparatus, which enables an observation of a high spatial resolution with several µm and a high temporal resolution with several nanoseconds, comprising a crystallization optical system to irradiate a laser light to a thin film provided on a substrate and to melt and crystallize the thin film, the laser crystallization apparatus comprises an illumination light source disposed out of an optical path of the laser light and emitting an illumination light for observation to illuminate the thin film, an illumination optical system comprising an annular optical element which has the optical path of the laser light in the center and which leads the illumination light from the illumination light source to the thin film along the optical path, and an observation optical system which displays a magnified image of the substrate including the thin film.

21 Claims, 6 Drawing Sheets

U.S. PATENT DOCUMENTS

2005/0040146 A1* 2/2005 Takami .................. 219/121.63
2005/0078298 A1 4/2005 Takami

FOREIGN PATENT DOCUMENTS

| DE | 103 39 237 A1 | 3/2004 |
|---|---|---|
| GB | 2 393 248 | 3/2004 |
| JP | 2001-257176 | 9/2001 |
| JP | 2002-176009 | 6/2002 |
| KR | 10-2004-0019934 | 3/2004 |

OTHER PUBLICATIONS

Mutsuko Hatano et al., "Excimer laser-induced temperature field in melting and resolidification of silicon thin films", Journal of Applied Physics, vol. 87, No. 1, Jan. 1, 2000, pp. 36-43.

* cited by examiner

LASER CRYSTALLIZATION APPARATUS AND LASER CRYSTALLIZATION METHOD

CROSS-REFERENCE TO RELATED APPLICATIONS

This application is based upon and claims the benefit of priority from prior Japanese Patent Applications No. 2004-069470, filed Mar. 11, 2004; and No. 2004-351734, filed Dec. 3, 2004, the entire contents of both of which are incorporated herein by reference.

BACKGROUND OF THE INVENTION

1. Field of the Invention

The present invention relates to a crystallization apparatus which irradiates laser light-to a thin film such as a semiconductor film and to a crystallization method, and more specifically to a laser crystallization apparatus and a laser crystallization method in which melting and crystallization process of the semiconductor film can be observed in a magnified image in real time.

2. Description of the Related Art

A laser crystallization technology has been developed, in which, for example, a high-energy short-pulse laser light is used to melt and crystallize a semiconductor thin film to make a non single-crystal thin film, for example, an amorphous or polycrystal semiconductor film into a crystallized thin film including an area with large crystal grains. This technology is used for crystallization of a non single-crystal semiconductor film used for a thin-film transistor for display devices such as liquid crystal display devices and organic electro luminescence display devices, for example.

Among such laser crystallization technologies, attention is focused on a Phase Modulated Excimer Laser Annealing (PMELA) which irradiates a phase-modulated excimer laser light for crystallization. The PMELA technology forms a homogenized excimer laser light into a laser light having a predetermined light intensity distribution. The laser light is phase-modulated by a phase modulating element, such as a phase shifter, for example, to have an inverse peak light intensity distribution. The laser light is irradiated through a crystallization optical system to a semiconductor film, for example, an amorphous or polycrystal silicon thin film formed on a glass substrate of large-area, such that the semiconductor film is melted and crystallized to form a semiconductor film having large crystal grains. According to the currently developed PMELA technology, an area of a size of about several mm square is melted and crystallized in one irradiation, such that a crystallized silicon thin film with high quality is formed which has relatively uniform and large crystal grains sized from several μm to about 10 μm. Details of which is described, for example, in "Amplitude and Phase Modulated Excimer-Laser Melt-Regrowth Method of Silicon Thin-Films—A New Growth Method of 2-D Position-Controlled Large-Grains-", published by Kohki Inoue, Mitsuru Nakata, Masakiyo Matsumura, in a thesis journal of Institute of Electronics, Information and Communication Engineers, Vol. J85-C, No. 8, pp. 624-629, 2002.

In the current PMELA technology, excimer laser light power varies from about 5% to 10% in a practical use. However, as compared with the stability of the excimer laser light, a process margin to form a crystallized silicon thin film having a predetermined quality is extremely narrow. Thus, to industrialize the EPMLA technology, the process margin needs to be increased to form the crystallized silicon thin film with a higher and stabilized quality. In response to this, there is a need to observe or measure a change of the silicon thin film through images or the like, in which the silicon thin film is melted in a small area and then crystallized, in real time with a high spatial resolution of several μm, and/or with a high temporal resolution of an order of nanoseconds (hereinafter referred as nsec) immediately after the laser light irradiation.

A method for evaluating crystallinity of a laser-annealed silicon thin film has been disclosed in Jpn. Pat. Appln. KOKAI Publication No. 2001-257176. This method comprises applying observation light to a silicon thin film being crystallized, using a spectrophotometer to subject reflected light to, for example, Raman spectrometry, and thus evaluating the crystallinity of a polycrystal silicon thin film after crystallization.

In an ELA technology which does not perform phase modulation, an experimental example in which thermal characteristics of a melted and crystallized silicon thin film are in-situ-measured by in-situ-measuring means has been reported in M. Hatano, S. Moon, M. Lee, K. Suzuki, and C. Grigoropoulos; J. Applied Physics, Vol. 87, No. 1, pp. 36-43, 2000, "Excimer laser-induced temperature field in melting and resolidification of silicon thin films". This report regards measurement of thermal characteristics of the melted and crystallized silicon thin film with a high temporal resolution of an order of nsec. More specifically, helium-neon (He—Ne) laser light (wavelengths 633 nm and 1520 nm) as a probe light for observation is applied to melted and crystallized area obliquely from above. Reflected and/or transmitted light from the melted and crystallized area is detected by a high speed responsive indium-gallium-arsenide photodetector and/or by a silicon pn photodiode to measure the thermal characteristics of the silicon thin film.

Furthermore, an in-situ observation method of simultaneously irradiating crystallization laser light and observation light has been disclosed in Jpn. Pat. Appln. KOKAI Publication No. 2002-176009. In the patent, an objective lens with hole is used both for irradiation of the crystallization laser light and for illumination and detection of the observation light. The crystallization laser light is excimer laser light which is not phase-modulated, and is irradiated to a film being processed through the hole provided to the objective lens. In an annealing process, the reflected light by the film being processed is detected though the objective lens with hole to measure in situ changes in reflectance, Raman spectrum and the like on, for example, of a sample surface. That is, crystallinity evaluation is executed from a physical property value of the crystallized area.

Problems in industrializing a mass production line for crystallization utilizing an ELA apparatus used here include improvement in yield of a crystallization process, and stabilization in quality control by monitoring the crystallization process by an operator due to instabilities of irradiating laser light, such as missing of a pulse and/or fluctuation in the intensity, for example. Where an irradiation period of a laser pulse for crystallization is very short, e.g., about 25 to 30 nsec. To solve these problems, there is a need to observe or measure, through images, a changing state or a crystallized area of the silicon thin film in situ and in real time with a high spatial resolution of several μm and with a high temporal resolution of the order of nsec immediately after laser light irradiation, wherein the silicon thin film is melted in a small area in a time period of about ten to several hundreds nsec and then crystallized.

The method in the Jpn. Pat. Appln. KOKAI Publication No. 2001-257176 described above is not suitable for the purpose of observing the crystallization of the silicon thin film through images. The method in the Jpn. Pat. Appln. KOKAI Publication No. 2002-176009 is available for observing through images, however it is not suitable for observing the changing silicon film from melting to crystallization through images with the high temporal resolution and/or high spatial resolution.

The method of M. Hatano et al. has high resolution in time, but is not applicable to an image observation system that satisfies both the high spatial resolution of several μm or less and the high temporal resolution of several nsec at the same time.

The present inventors have found out that, for a higher quality of the crystallized semiconductor thin film, it is desired to install an image observation system, that is, an optical system for observation, in a laser crystallization apparatus, for example, an excimer laser crystallization (ELA) apparatus. In which the semiconductor thin film is changing from a melted state to a crystallized state, and is observed through images with a high spatial resolution of several μm and with a high temporal resolution of the order of nsec, in real time or during laser melting, or the crystallization immediately after melting.

The present inventors have therefore studied incorporating a microscopic observation system capable of image observation into the ELA apparatus in order to enable the in-situ (real-time) observation. To incorporate a microscopic observation optical system into an optical system of the ELA apparatus, it is preferable to use an optical system in which aberration correction has been made simultaneously for excimer laser light for crystallization (ultraviolet light) and illumination light for observation (visible light). The microscopic observation optical system is capable to observe image of a melted and crystallized semiconductor film or a crystallized area, in situ (in real time).

The following problems additionally arise to solve problems described above and to satisfy desire described above. A high resolution (several μm) is preferable in the ELA apparatus, particularly in a projection type phase modulated (PM) ELA apparatus using a phase shifter. It is assumed that lenses practically used in the PMELA apparatus are used at a high light intensity, at high duty and in a large area for production efficiency. More specifically, the laser light intensity is preferably about 1 J/cm$^2$ on a substrate to be crystallized. In order to obtain the high light intensity, the excimer laser light is used with a wide spectral bandwidth (0.5 nm), unlike in an aligner used for large-scale integrated circuit production. Due to the high-energy light, a lens configuration including pasted and laminated lenses such as microscopic lenses for visible light is not preferable in terms of heat resisting properties. Further, the excimer laser light to be used is, for example, krypton fluoride (KrF) or xenon chloride (XeCl), and their wavelengths are 248 nm and 308 nm, respectively. When the wavelengths of these laser lights are taken into account, lens materials that can preferably be used are limited to UV-grade synthetic quarts or calcium fluoride ($CaF_2$), which reduces the freedom in lens designing. Moreover, for example, the correction of aberration, such as chromatic aberration and distortion aberration of the ultraviolet light, has to be made for the lens (group) used in the PMELA apparatus, for example, to transfer a mask pattern of the phase shifter onto the substrate in a reduced or equal size with a high resolution of about several μm.

When the excimer laser light and the microscopic observation visible light are used in this single optical system, the aberration correction has to be made simultaneously in two wavelength areas including the ultraviolet light and the visible light, which is a significantly difficult problem. Even if the chromatic aberration can be corrected, the number of lenses has to be increased, thus increasing the absorption of light by the lenses. This reduces the intensity of the laser light arriving onto the substrate, which goes against the demand to obtain a high light intensity preferred for crystallization.

Another problem is that the crystallization optical system adapted to the excimer laser light with the above-described performance reduces the resolution of the visible light when it transmits the visible light. Specifically, the resolution is proportional to the wavelength of light, so that in the case of the visible light (wavelength: 480 nm to 600 nm) having about double of the wavelength of the excimer laser light (wavelength: 248 nm, 308 nm), for example, a resolution of 2 μm is reduced to about 4 μm in the visible light, which is double the former. As a result, it cannot be obtained a resolution of 1 μm necessary to observe or measure the images of the crystallized area of several μm.

That is, the optical system that can accommodate such a demand need to be stably used for at least two different wavelengths: the excimer laser light for crystallization (e.g., wavelength 248 nm) having a high light intensity (e.g., 1 J/cm$^2$ or higher on the substrate), a large irradiation area (e.g., 5.5 mm$^2$ or larger) and high duty (e.g., a laser operating frequency of 100 Hz or higher), and the illumination light for observation being, for example, the visible light (e.g., wavelengths ranging from 480 nm to 650 nm).

As such an example, a high resolution UV laser condenser lens for microscopes, for example, model KVH20-8, Showa Optronics, is commercially available, in which chromatic aberration is corrected simultaneously in wavelength ranges of both the ultraviolet light and visible light. The condenser lens is designed to use one optical system to process a small area (e.g., 0.5 mm$^2$ or less) with the excimer laser light and to observe with the visible light. The processing of the small area by the optical lens is intended to, for example, cut a part of wiring in an integrated circuit by irradiating the laser light. The lens sufficiently satisfies the desire with the spatial resolution (1 μm), but is not capable of an operation with the above-described high light intensity, large irradiation area and high duty.

Furthermore, an observation needs to be made with a high temporal resolution of an extremely short-time (nsec) to observe in real time through the images of the semiconductor film provided on the substrate in a melting and crystallizing state. It requires a high-luminance illumination light source for observation conforming to the short-time observation. If the visible light is applied as such illumination light for observation through a large number of optical lenses, this causes not only a problem of loss in amount of light but also a problem of an adverse effect on the imaging performance of the original ultraviolet light.

An object of the present invention is to provide a laser crystallization apparatus and a laser crystallization method in which images of an area of several μm on the semiconductor thin film melting and crystallizing in several hundreds nsec can be observed or measured in real time or immediately after that with a high spatial resolution of several μm or less and with a high temporal resolution.

BRIEF SUMMARY OF THE INVENTION

Problems and concerns described above can be solved by a laser crystallization apparatus and a laser crystallization method set forth below.

According to one aspect of the present invention, a laser crystallization apparatus comprising a crystallization optical system to irradiate a laser light to a thin film provided on a substrate and to melt and crystallize the thin film, the laser crystallization apparatus comprises: an illumination light source disposed out of an optical path of the laser light and emitting an illumination light for observation to illuminate the thin film; an illumination optical system comprising an annular optical element which has the optical path of the laser light in the center and which leads the illumination light from the illumination light source to the thin film along the optical path; and an observation optical system which displays in a magnified image an image of the substrate including the thin film.

According to another aspect of the present invention, a laser crystallization method comprising: emitting a laser light; irradiating the laser light to a thin film provided on a substrate to melt and crystallize the thin film; illuminating a laser irradiated area with an observation illumination light along a optical path of the laser light, wherein the illumination light is led to the thin film via a reflection type annular optical element, the annular optical element is disposed coaxially with the optical path of the laser light and passes through the laser light, in which the optical path of the laser light is provided in the center; magnifying and imaging the reflected observation illumination light by the thin film as at least one image of melting or crystallizing state in the thin film; and picking up the magnified image.

Additional advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 4A to 4E are diagrams showing examples of timing chart to observe melting and crystallization of a semiconductor film in an apparatus shown in FIG. 1, wherein

FIGS. 6A, 6B show one example of observation result of a crystallization process in accordance with the apparatus shown in FIG. 1, wherein FIGS. 7A, 7B show another example of observation result of the crystallization process, wherein

DETAILED DESCRIPTION OF THE INVENTION

The embodiments of the present invention will be described with reference to the accompanying drawings. The accompanying drawings, which are incorporated in and constitute a part of the specification, illustrate embodiments of the invention, and together with the general description given above and the detailed description of the embodiments given below, serve to explain principles of the invention. Throughout the drawings, corresponding portions are denoted by corresponding reference numerals. The embodiments are only examples, and various changes and modifications can be made without departing from the scope and spirit.

In an ELA apparatus, to observe or measure images of a crystallization process area of several µm in real time where a semiconductor thin film is melted and crystallized in several hundreds nsec, it is necessary to manage both demands from an excimer laser crystallization optical system for crystallization and from a microscopic observation system for image observation. That is, it is necessary to satisfy a high resolution of several µm in an ultraviolet light and a high light intensity of about 1 J/cm$^2$ on a substrate which are demands of the crystallization optical system, as well as a high resolution of several µm in a visible light and a high temporal resolution of an order of nsec which are demands of the microscopic observation system.

In order to solve these problems, an observation illumination optical system for image observation and a microscopic observation system are incorporated into a laser crystallization apparatus independently from the crystallization optical system. The microscopic observation system includes a microscopic observation optical system which enables to observe with a high resolution of several µm and a high temporal resolution of the order of nsec. Examples of the configuration and application of the present embodiment will be described below by referring to drawings accompanied.

Figure 1:
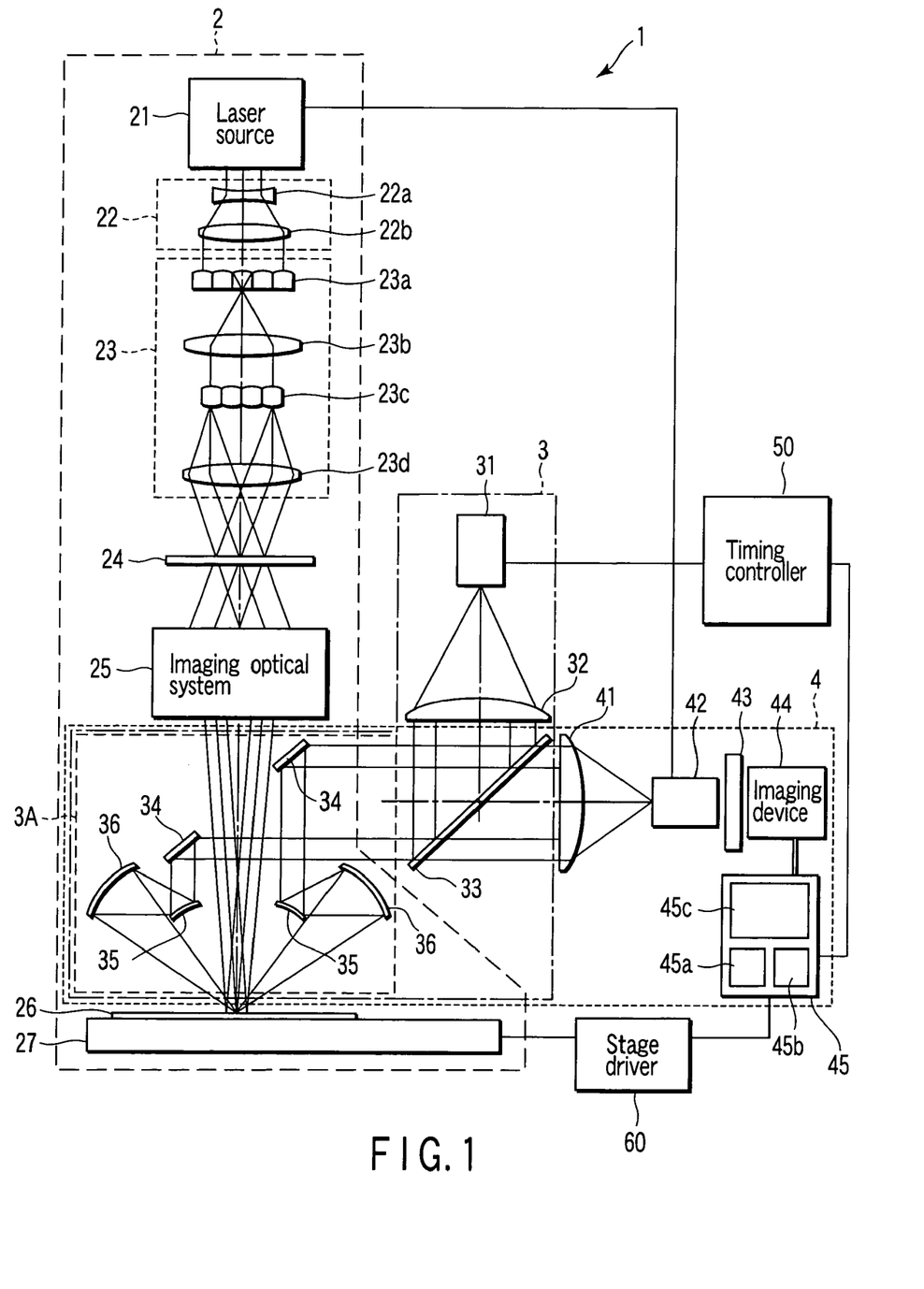
FIG. 1 is a system configuration diagram to explain an embodiment of the present invention.

FIG. 1 is a diagram showing an overview of a laser crystallization apparatus 1 of the present embodiment. The apparatus is a laser crystallization apparatus 1 projecting an image of a phase modulating element in a reduced size and comprising a reflection type microscopic observation system. Further, it has a function to correct displacement of a substrate 26 being crystallized on the basis of an image observation result from the microscopic observation system.

As shown in FIG. 1, the laser crystallization apparatus 1 comprises a crystallization optical system 2 which irradiates laser light onto a predetermined area on the substrate 26 to melt and crystallize a semiconductor film provided on the substrate 26 for crystallization; a reflection type observation illumination optical system 3 which applies illumination light to observe the melted and crystallized part of the semiconductor film; a reflection type microscopic observation optical system 4 to measure and observe the melting and crystallization occurred in several hundreds nsec in an area of several μm in the semiconductor film through images; and a stage driver 60. The present embodiment is characterized in that an independent observation illumination optical system 3 for high-luminance visible light and an independent reflection type microscopic observation optical system 4 are coaxially disposed in a space between an imaging optical system 25 and the substrate 26, since an imaging optical system 25 in the crystallization optical system 2 has a long focal distance (50 mm to 70 mm). That is, the observation illumination optical system 3 and the microscopic observation optical system 4 are independent from the crystallization optical system 2 and do not interfere with each other.

The present embodiment concerns the laser crystallization apparatus and a laser crystallization method characterized in that crystallization laser light, for example, excimer pulse laser light is irradiated to an area of, for example, about 4 mm² to 25 mm² in the semiconductor film provided on the substrate 26 for crystallization in order to execute melting, solidification and crystallization, so that a change of state in an area of the order of μm irradiated with an observation illumination light and occurred only in a period of several 10 nsec is displayed as an image on a monitor screen 45c in real time.

Such a microscopic observation system which picks up images changing at an extremely high speed in several hundreds nsec in a extremely small area of several μm is characterized in that the crystallization optical system 2 is formed on a central axis, and an annular optical element 3A is provided which constitutes the reflection type observation illumination optical system 3 and microscopic observation optical system 4 around an optical path of the crystallization optical system 2 in such a manner that the annular optical element 3A does not block the optical path of the laser light. This enables the observation or monitoring with a high spatial resolution of several μm and with a high temporal resolution of nsec order. Images of the changes in the crystallization process area occurred in only several hundreds nsec where the crystallization laser light is irradiated are picked up by the microscopic observation optical system 4, and stored in a storage unit 45b, for example, a memory. It enables to display the changes in state in the crystallization process area of several μm as still images or video pictures on the monitor screen 45c, under desired conditions of an observer, for example, at a desired velocity, after crystallization, or in real time. Here, the crystallization process area refers to an area which is irradiated with the crystallization laser light changing from a melting process to a solidification process until complete the crystallization.

First, the crystallization optical system 2 will be described referring to FIG. 1. The crystallization optical system 2 comprises a laser source 21, a beam expander 22, a homogenizer 23, a phase modulating element 24 such as a phase shifter, the imaging optical system 25, and a substrate holding stage 27 which guides the substrate 26 to a predetermined position. Laser light from the laser source 21 is expanded by the beam expander 22, and light intensity in a cross-sectional plane is homogenized by the homogenizer 23, and then the laser light is irradiated to the phase modulating element such as the phase shifter 24. Excimer laser light which has passed through the phase shifter 24 is modulated light having a desired light intensity distribution, for example, an inverse peak light intensity distribution, and is irradiated onto the substrate 26 through the imaging optical system 25 such as an excimer imaging optical system.

The laser source 21 outputs pulse laser light of, for example, about 25 to 30 nsec in width, having an energy of, for example, 1 J/cm², which is sufficient to melt a semiconductor film that is not single-crystal, for example, an amorphous or polycrystal semiconductor film, provided on the substrate 26. The laser light is preferably KrF excimer laser light having a wavelength of 248 nm. Other irradiation lights include XeCl excimer laser light, argon fluoride (ArF) excimer laser light, argon (Ar) laser light, YAG laser light, an ion beam, an electron beam and a xenon (Xe) flash lamp. For example, the excimer laser source 21 is a pulse oscillating type and has an oscillation frequency ranging, for example, from 100 Hz to 300 Hz, and a pulse width ranging, for example, from 20 nsec to 100 nsec in half-value width. In the present embodiment, the KrF excimer laser light whose half-value width is 25 nsec is used. Further, light energy of the KrF excimer laser light irradiated onto the substrate 26 is about 1 J/cm². The oscillation frequency is, for example, at 100 Hz and the area irradiated with the excimer laser light is, for example, 2 mm×2 mm, such that the excimer laser light is step-irradiated while the substrate 26 is moved at a step of, for example, 2 mm by the substrate holding stage 27, and the moving velocity of the substrate 26 will thus be 200 mm/sec.

The beam expander 22 expands an incident laser beam, and comprises a concave lens 22a for expanding the beam and a convex lens 22b for forming parallel beam, as shown in FIG. 1. The homogenizer 23 determines a sectional dimension of the incident laser beam in X-Y direction and homogenizes the beam intensity distribution within that determined shape. For example, a plurality of X-direction cylindrical lenses are arranged in Y direction to form a plurality of light fluxes arranged in Y direction, each light flux is redistributed in Y direction by an X-direction condensing lens, similarly a plurality of Y-direction cylindrical lenses are arranged in X direction to form a plurality of light fluxes arranged in X direction, and each light flux is redistributed in X direction by a Y-direction condensing lens. That is, as shown in FIG. 1, the homogenizer 23 comprises a first homogenizer including a first fly-eye lens 23a and a first condensing lens 23b, and a second homogenizer including a second fly-eye lens 23c and a second condensing lens 23d. The first homogenizer adjusts the incidence angle of the laser light uniform on the phase shifter 24, and the second homogenizer homogenizes the positional laser light intensity on the phase shifter 24 within the cross-section. Therefore, by using the homogenizer 23, the KrF excimer laser light is conditioned to an illumination light having desired angle dispersion and homogenized beam intensity in its cross-section, and irradiates the phase shifter 24.

The phase shifter 24 is one example of the phase modulating element, and is a quartz glass substrate having steps, for example. The laser light causes diffraction and interference at a boundary of the step to provide a periodic spatial distribution in the laser light intensity, and a phase difference of 180° is provided in right and left side of the boundary, for example. The phase shifter 24 with a phase difference of 180° in right and left modulates the phase of the incident light to a light having a symmetrical inverse peak light intensity distribution. A step (thickness difference) d can be derived from $d=\lambda/2 (n-1)$, where $\lambda$ is the wavelength of the laser light and n is a refractive index of a transparent substrate of the phase shifter. From the equation, the phase shifter 24 can be produced by, for example, forming the step d on the quartz glass substrate corresponding to the predetermined phase difference. The step on the quartz glass substrate can be formed by selective etching or an FIB (Focused Ion Beam) process. For example, when the refractive index of the quartz substrate is 1.46, the wavelength of the XeCl excimer laser light is 308 nm, so that the step to provide a phase difference of 180° will be 334.8 nm. The phase shifter 24 has the step formed in such a manner that the incident light is phase-modulated to form the inverse peak light intensity distribution, and shifts the phase of the excimer laser light by a half-wave length. As a result, the laser light irradiated on the semiconductor film will have a light intensity distribution in a pattern with an inverse peak in which a part corresponding to a phase shifted portion is at a minimum light intensity. According to this method, a desired beam light intensity distribution can be obtained without using a metal pattern which is commonly used in other methods to shield the excimer laser light.

The laser light which has passed through the phase shifter 24 is imaged with a predetermined light intensity distribution on the substrate 26 placed in a position of a conjugate relation with the phase shifter 24 by the excimer imaging optical system 25 whose aberration is corrected. The imaging optical system 25 comprises a lens group including a plurality of calcium fluoride ($CaF_2$) lenses and/or synthetic quarts lenses, for example. The imaging optical system 25 is a long focal distance lens having performance such as a reduction ratio of 1/5, an N.A. of 0.13, a resolution of 2 μm, a depth of focus of ±10 μm, and a focal distance of 50 mm to 70 mm.

The imaging optical system 25 arranges the phase shifter 24 and the substrate 26 at optically conjugate positions. In other words, the substrate 26 is disposed on a place optically conjugate with the phase shifter 24 (an imaging plane of the imaging optical system). The imaging optical system 25 comprises an aperture disposed between lenses.

Regarding the substrate 26 for crystallization, generally, a film being processed, for example, a semiconductor film is formed on a substrate via an insulating film, on which another insulating film is provided as a cap film. As the semiconductor film being processed, for example, an amorphous silicon film, a polycrystal silicon film, a sputtered silicon film, a silicon germanium film, a dehydrogenized amorphous silicon film can be used. As the substrate, for example, a glass substrate, a plastic substrate, a semiconductor substrate (wafer) such as silicon can be used. For the substrate 26 used in the present embodiment, the dehydrogenized amorphous silicon film is formed to have a predetermined thickness, for example, a thickness of 50 nm, on the glass substrate. The substrate 26 is held detachably to the substrate holding stage 27 which holds the substrate at a predetermined position and which can move in X, Y and Z directions.

As described above, the laser crystallization apparatus 1 is a projection type crystallization apparatus, in which the crystallization laser light is homogenized and phase-modulated by the phase shifter 24 to form the inverse peak light intensity distribution, thereby irradiating the laser light to the substrate 26. The light pattern causes the crystallization to progress in a horizontal direction and enables large crystal grains to grow about 10 μm in size in the semiconductor film, for example. The crystallization process changes in an extremely high-speed, and finishes in an extremely short time period of several 10 nsec to several 100 nsec. The reflection type microscopic observation system having a resolution of several μm is provided to microscopically observe, monitor or measure the images of the crystallization process changing at the extremely high speed. The reflection type optical system is characterized by having no loss due to chromatic aberration and absorption compared with an objective lens consisted of lenses having a hole.

The reflection type microscopic observation system comprises the reflection type observation illumination optical system 3 which emits the illumination light for observation, and the reflection type microscopic observation optical system 4 which can receive the light reflected by the crystallization process area in the substrate 26 and display it on the screen as images in real time. Part of the reflection type microscopic observation optical system 4 is shared with part of the reflection type observation illumination optical system 3, and is provided between the imaging optical system 25 and the substrate holding stage 27. The shared part coaxially overlaps optical paths of the illumination light with optical paths of the crystallization laser light, and constitutes a composite optical system. The composite optical system is an optical system that enables the crystallization process and the crystallization state observation process to be implemented at the same time without mutual interference. Annular observation illumination light and microscopic observation light enable to observe, monitor or measure the crystallization process with a high spatial resolution of several μm and with a high temporal resolution of several nanoseconds.

In the reflection type microscopic observation system, observation illumination light emitted from an observation illumination light source 31 is applied to the substrate 26 via a half mirror 33 and the reflecting annular optical element 3A. Observation light reflected by the substrate 26 returns through the path substantially opposite to that of the illumination light and enters to a photodetector 42 of the microscopic observation optical system 4.

The observation illumination optical system 3 is an annular optical system provided with a window hole in its center to pass the crystallization laser light without blocking the optical path of the crystallization laser light. The illumination light from the high-luminance observation illumination light source 31 becomes doughnut-shaped by the reflecting annular optical element 3A which will be described later, and is coaxially applied to the substrate 26 along the crystallization excimer laser light.

The observation light reflected by the substrate 26 returns through an optical path of the annular optical element 3A opposite direction to that of the illumination light, and passes through the half mirror 33 and then is detected in the microscopic observation optical system 4. In the microscopic observation optical system 4, the observation light which has passed through the half mirror 33 is imaged on the front surface of the photodetector 42, which is a light receiving surface, by an imaging lens 41, and an image obtained through the photodetector 42 and an image intensifier 43 is converted into an image signal by a two-dimensional imaging device 44 and extracted as image data by an image processing unit 45.

In the observation illumination optical system 3, for example, the illumination light from the high-luminance observation illumination light source 31 is formed into parallel light by a beam expander 32 and is directed to the annular optical element 3A by the half mirror 33. Then the illumination light is turned toward the substrate 26 by an annular plane mirror 34 and is converged onto the semiconductor film on the substrate 26 by an annular convex mirror 35 and an annular concave mirror 36. The annular observation illumination light illuminates the crystallization process area in the crystallization process. The observation light reflected by the crystallization process area on the semiconductor film is directed to the half mirror 33 via the annular concave mirror 36, the annular convex mirror 35 and the annular plane mirror 34 through the optical path opposite to that of the illumination light. The observation light passes through the half mirror 33 and the imaging lens 41, and forms an image of the crystallization process area in the semiconductor film on the light receiving surface of the photodetector 42.

For the observation illumination light source 31, a high intensity light source, for example, a xenon (Xe) flash lamp or a visible laser light source such as Ar laser, helium-neon (He—Ne) laser can be used to allow an observation with a temporal resolution of the order of nsec. The beam expander 32 is preferably capable of forming the parallel light with a small number of lenses to reduce loss in the irradiated light, and an aspherical lens can be used, for example. The half mirror 33 reflects the illumination light from the illumination light source 31 and changes its direction, but transmits the observation light reflected and returning from the semiconductor film. The annular plane mirror 34, the annular convex mirror 35 and the annular concave mirror 36 are disposed in the optical path of the crystallization excimer laser light, so that they have to be annular not to block the optical path. The window hole of the annular plane mirror 34 may have a diameter of about 13 mm at a position about 50 mm away from the substrate 26 to transmit the excimer laser light without blocking it, assuming that the area to be irradiated with the excimer laser light is about 2 mm×2 mm to 5 mm×5 mm on the substrate 26 and a glancing angle of the laser light on the substrate 26 is about 7°. Other configurations can be considered for the reflection type observation illumination optical system 3, and they can also be used.

Figure 2:
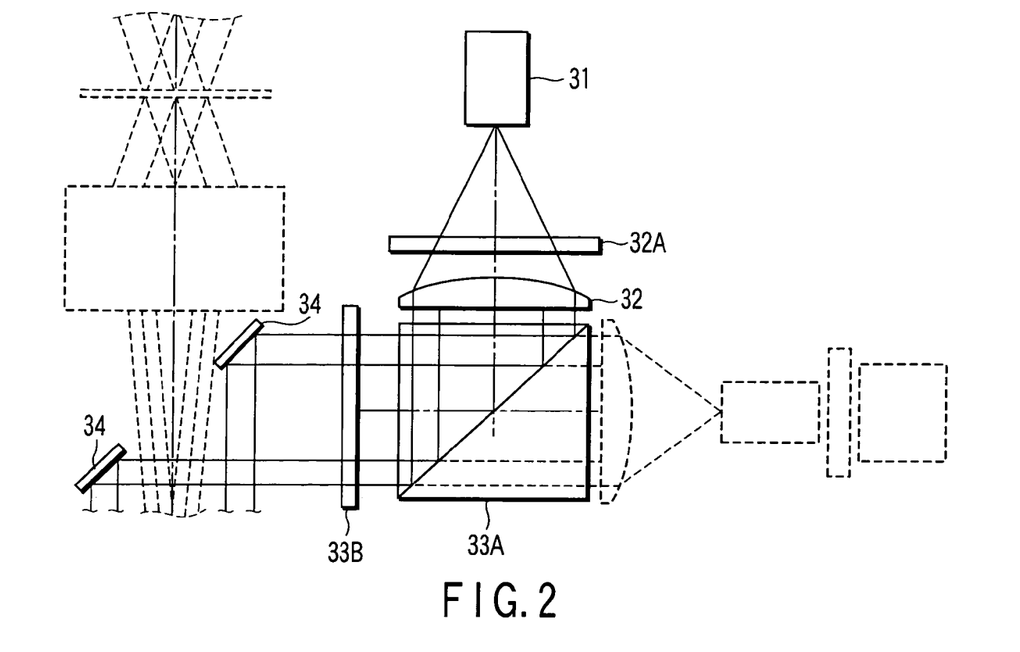
FIG. 2 is a diagram showing an example of a configuration where polarized laser is used to the observation illumination optical system in FIG. 1.

One of the modifications is a method of using polarized laser light as the observation illumination light. The use of the polarized laser light enables the illumination light to be completely separated from the observation light reflected and returning from the substrate 26. One example of a modified part of the optical system is shown in FIG. 2. As shown in the drawing, a polarizer 32A is used in front of the beam expander 32, and a polarizing beam splitter 33A and a quarter-wave plate 33B are used instead of the half mirror 33. Such a configuration allows the polarized laser light to be used as a light source. The quarter-wave plate 33B is disposed such that its crystal axis is offset by 45° with respect to a transmission axis of the polarizer. Owing to this arrangement, an oscillation surface of the illumination polarized laser light and an oscillation surface of the observation polarized laser light reflected by the substrate 26 are displaced by 90°, so that the polarizing beam splitter allows the illumination light and the observation light to be completely separated.

One modification of the annular optical element includes changing the annular plane mirror 34 to the annular concave mirror. This configuration allows the annular concave mirror 36 to be disposed closer to the annular convex mirror 35, or allows the illumination light to converge on the substrate 26 without using the annular convex mirror 35 and the annular concave mirror 36.

In another modification, a converging lens can be disposed between the half mirror 33 and the annular plane mirror 34 and out of the optical path of the crystallization laser light. In the configuration, the annular convex mirror 35 and the annular concave mirror 36 can be omitted, and the annular plane mirror 34 can be disposed closer to the substrate 26, and moreover, its window hole can be made smaller.

In still another modification, the annular convex mirror 35 and the annular concave mirror 36 can be disposed at a longer distance, and the annular plane mirror 34 can be disposed therebetween. Other modifications can be considered for annular reflecting optical system, for example, disposing the annular plane mirror 34 between the phase shifter 24 and the imaging optical system 25, and one of these modifications can be used.

The observation light reflected by the substrate 26 reaches to the half mirror 33 through the path opposite to that of the illumination light, the annular concave mirror 36, the annular convex mirror 35 and the annular plane mirror 34. The observation light passes through the half mirror 33 and is brought to the microscopic observation optical system 4.

The microscopic observation optical system 4 comprise, for example, a microscopic imaging optical system 41, a photodetector 42, an image intensifier 43, an imaging device 44 and an image processing unit 45, in addition to the annular optical element 3A and the half mirror 33 shared with the observation illumination optical system 3.

The observation light passed through the half mirror 33 is processed by the microscopic observation optical system 4 which has a function of, for example, first imaging the observation light by the imaging lens 41 and then imaging it in a magnified image. The observation light from the crystallization process area of order of several μm on the substrate 26 is imaged, by the imaging lens 41, on a light receiving surface 42a of the photodetector 42 with a high resolution of several μm. The light receiving surface 42a of the photodetector 42 is slit-shaped to observe the crystallization state which changes at a high speed. The light receiving surface 42a is a photoelectric surface which converts light into electrons. The slit-shaped light receiving surface 42a is rectangular of a width of several mm and a length of several cm, for example. The high spatial resolution image of the crystallization process area formed on the light receiving surface 42a with a resolution of several μm is intensified by the photodetector 42 and image intensifier 43, and is taken as a high-resolution image by the imaging device 44. The image data is subjected to signal processing by the image processing unit 45. The signal processing includes, for example, analysis of the image data, storing of the image data and displaying of the image data on the display unit 45c.

Figure 3:
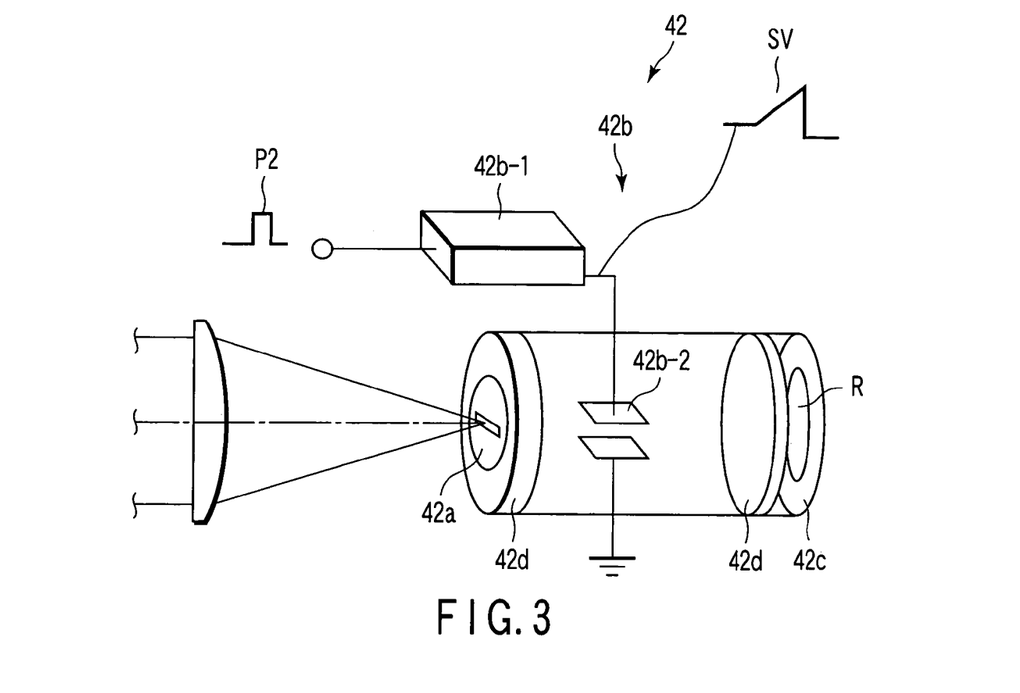
FIG. 3 is a configuration diagram to explain a configuration of a streak tube which is an example of a photodetector in FIG. 1.

The photodetector 42 is preferably, for example, a photoelectric tube such as a streak camera, as shown in FIG. 3. For the streak camera, a streak tube can be used which is capable of converting an incident light image into photoelectrons and then again converting it to light image, and making a one-dimensional image to change with time in a high temporal resolution of several nsec.

The general streak tube 42 is a vacuum tube for specific use, and has a configuration as shown in FIG. 3. The image formed by the incident light is converged and received on the slit-shaped light receiving surface 42a. The slit-shaped image is a one-dimensional image in the crystallization process area. The light receiving surface 42a converts the one-dimensional image of the incident light into photoelectrons. A photoelectron beam produced in the light receiving surface 42a passes though a sweep electrode 42b-2. The sweep electrode 42b-2 is provided with a pair of electrodes to sweep the photoelectron beam in an X or Y direction. A sweep voltage SV is applied from a sweep circuit 42b-1 to the sweep electrode 42b-2. The sweep circuit 42b-1 supplies the sweep voltage SV (see FIG. 3, FIG. 4D) changing with time to the sweep electrode 42b-2 in accordance with such timing that the sweep circuit 42b-1 is controlled by a trigger signal P2 (see FIG. 3, FIG. 4B) from a timing controller (FIG. 1, 50). The photoelectron beam is bent in a amount varying with time according to change of the sweep voltage, and displays a projected image R of the photoelectron beam on a fluorescent screen 42c at different positions as a function of time. The projected image R is a high-resolution image in which the slit-shaped one-dimensional image is swept by time to become a two-dimensional image, and a temporal change of the order of nsec in the image received on the light receiving surface 42a is displayed as a change in a position on the fluorescent screen 42c. At least one of an accelerating electrode 42d or an electron multiplier 42e may be integrally incorporated to improve the sensitivity of the streak tube 42.

The high-resolution two-dimensional image formed on the fluorescent screen 42c of the streak tube 42 is luminance intensified by the image intensifier 43, thereby forming high-luminance two-dimensional light-intensified image. That is, the image intensifier 43 has the following functions. The high-resolution optical image obtained by the streak tube 42 is picked up by an imaging lens (not shown), and then imaged again on the photoelectric surface of the image intensifier 43. The photoelectric surface is formed on an inner wall of a vacuum vessel. Photo-electrons released from the photoelectric surface are accelerated, converged and reduced by an electron lens provided in the vacuum vessel, and falls on a fluorescent screen within the image intensifier 43. An image whose luminance is intensified by the above-described acceleration and reduction is displayed on the fluorescent screen of the image intensifier 43.

The two-dimensional light-intensified image displayed on the fluorescent screen of the image intensifier 43 is picked up by the imaging device 44, for example, a two-dimensional CCD imaging device, and converted into image data. Since the CCD imaging device 44 picks up images having a significantly small amount of light, it is preferable to suppress a dark current and improve an S/N ratio. Therefore, a cooled CCD imaging device used at a low temperature (e.g., from minus several 10° C. to about a liquid nitrogen temperature) is preferable.

The image data from the CCD imaging device 44 is processed under the control of the image processing unit 45, for example, a control circuit 45a of a personal computer, and then stored. The data processing includes, for example, computation of the width of the crystallized area after a predetermined time has passed. The image data and the computed data are stored in the storage unit 45b, for example, a memory, and displayed on the display unit 45c at the same time, as necessary. The data displayed on the display unit 45c can be used to monitor the progress of crystallization by a person in charge of the crystallization process. Further, since the image data is stored in the storage unit 45b, a desired image can be extracted as a still image or a slow-motion image and displayed on the display unit 45c, under the control of the control circuit 45a.

Figure 4A:
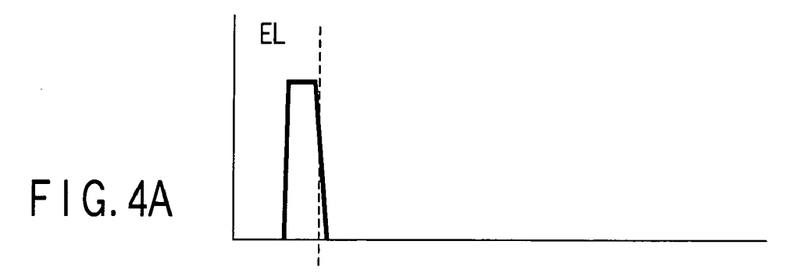
FIG. 4A shows timing of a crystallization pulse laser light EL.
Figure 4B:
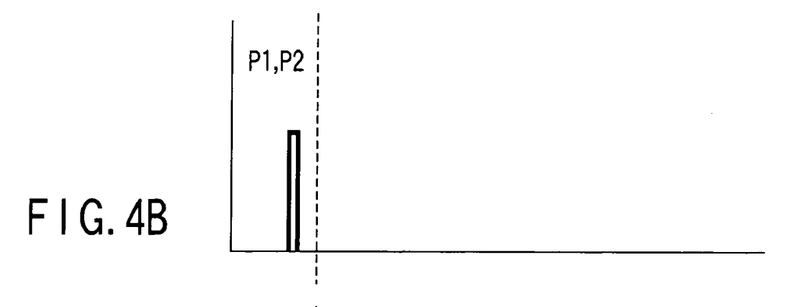
FIG. 4B shows timings of a trigger signal P1 for an observation illumination light OL and a trigger signal P2 for a sweep voltage SV of the streak tube.
Figure 4C:
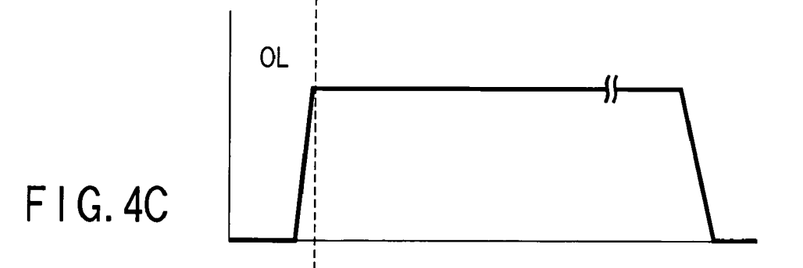
FIG. 4C shows timing of the observation illumination light OL.
Figure 4D:
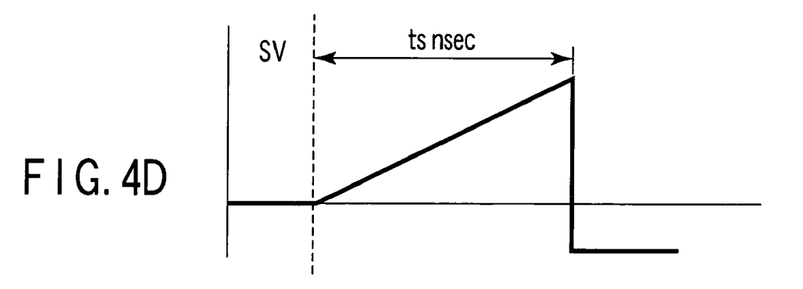
FIG. 4D shows timing of a sweep voltage SV of a streak tube 42.
Figure 4E:
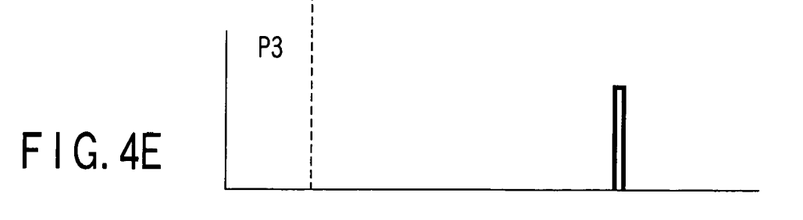
FIG. 4E shows timing of a trigger signal P3 to an imaging device.

With such a configuration of the microscopic observation optical system 4, a necessary observation can be made with a high temporal resolution of the order of several nsec and with a high spatial resolution of several μm. The laser crystallization apparatus 1 comprises a timing controller 50. The timing controller 50 controls various kinds of timing for, for example, a crystallization laser light source 10, the observation illumination light source 31 and the microscopic observation optical system 4. One example of which is shown in FIGS. 4A-4E. The timing controller 50 sends a trigger signal P1 (FIG. 4B) which starts the irradiation of observation illumination light OL and a trigger signal P2 (FIG. 4B) which starts the application of the sweep voltage SV for the streak tube 42, in synchronization with an irradiation pulse of a crystallization pulse laser light EL (FIG. 4A). When the observation illumination light source 31 receives the trigger signal P1, it emits an observation illumination light OL (FIG. 4C). When a sweep voltage generator 42b of the streak tube 42 receives the trigger signal P2, the sweep voltage generator 42b instructs a sweep circuit 42b-1 to generate the sweep voltage SV changing with time for a time period of $t_s$, and applies the sweep voltage SV to the sweep electrode 42b-2 (FIG. 4D). When the application of the sweep voltage is finished, the timing controller 50 sends a trigger signal P3 (FIG. 4E) to the imaging device 44, and the imaging device 44 picks up the two-dimensional image on the fluorescent screen of the image intensifier 43 as an image data.

Figure 5:
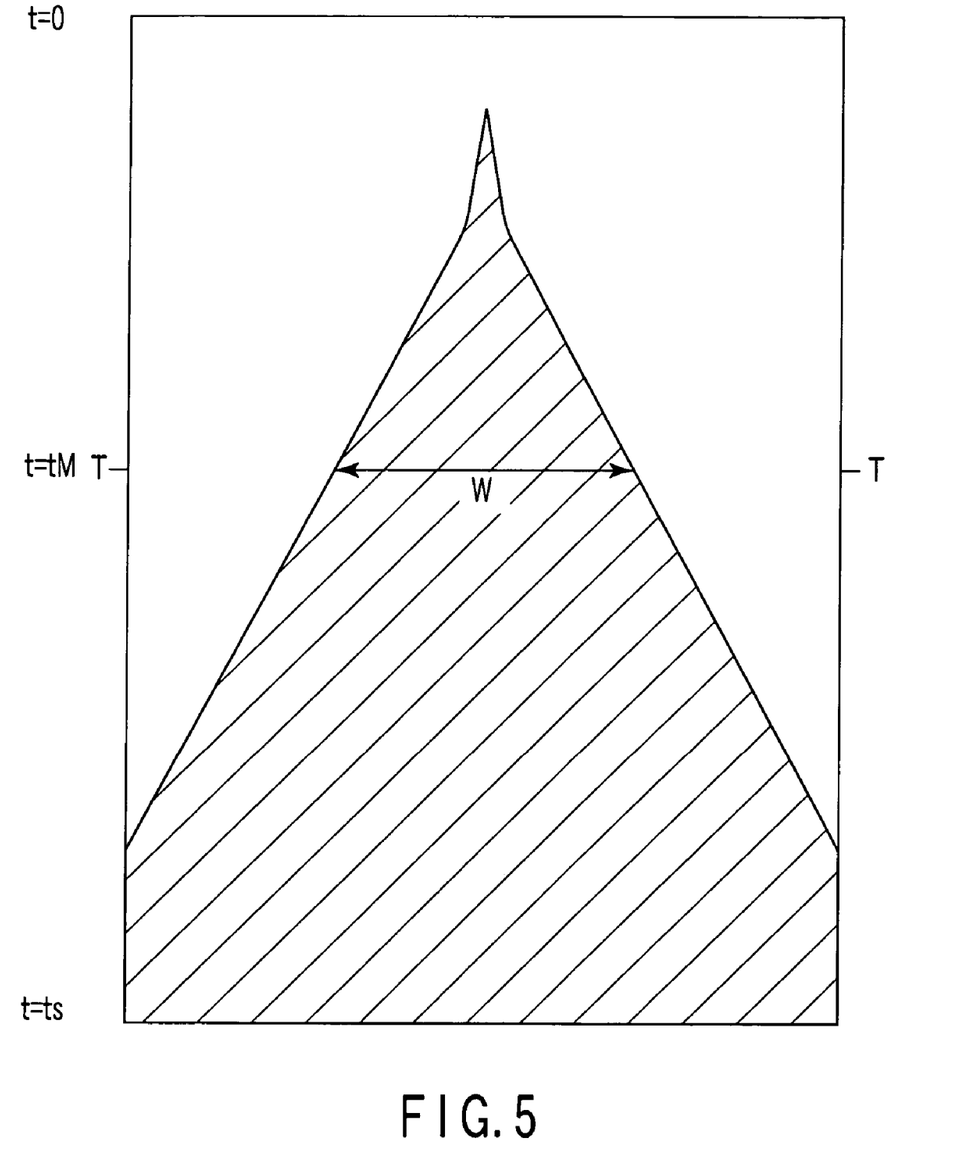
FIG. 5 is a schematic diagram to explain an image displayed on a display unit in FIG. 1.

For example, FIG. 5 is a schematic diagram of the image data obtained as described above, and explains the observation of the semiconductor film changing in the crystallization process. The figure shows an image created by time scanning the one-dimensional image of a predetermined area in the semiconductor film changing with time. A horizontal axis represents a position on the semiconductor film, and a vertical axis represents time passed. The crystallization pulse laser light phase-modulated and having the inverse peak light intensity distribution is irradiated on the substrate 26 being crystallized for about 25 nsec. As a result, the irradiated area of the semiconductor film is melted, and the melt temperature has a distribution that is low in the center and high in both sides thereof in accordance with the inverse peak light intensity distribution. When the crystallization laser light is stopped, the temperature of the irradiated area starts to cool. The temperature gradient in the cooling period corresponds to that of the inverse peak light intensity distribution, and the solidification or crystallization starts at the center of the melt. A crystallizing position, i.e., a solid-liquid interface, moves laterally from the center to the outward in accordance with the temperature gradient. The semiconductor film changing in the crystallization process is imaged by the microscopic observation optical system 4 in such a manner that the observation illumination light emitted from the observation illumination light source 31 is applied to the crystallization process area simultaneously, thereby enabling the crystallizing state to be observed and/or measured as an image with a spatial resolution of several μm and a temporal resolution of several nsec. The observation is, for example, an observation of the state of crystallization, and measurements such as the size of the crystallized area and time in the crystallization process.

In the observation, the width of the image can be set to any desired size, although it is actually several 100 μm or more. In FIG. 5, a portion of the laser light having one inverse peak pattern is shown in a magnified image for simplicity, and the width is 10 μm, for example. The height of the image can also be set to any desired time. Here, the time span is set to correspond to the application time of the sweep voltage SV, $t_s$=300 nsec.

The silicon film becomes metallic when it is melted, thus reflects the visible light well. On the other hand, the crystallized part transmits the visible light well, particularly red light. Therefore, in the reflected light observation, the melted area will be observed as a bright image, and the crystallized area will be as a dark image. In FIG. 5, a shaded area represents the solidified (crystallized) area of the silicon film, and a white area represents the melted area. An upper end of FIG. 5 corresponds with immediately after melting, and is a bright image (white area) in the whole width. It is observed that the crystallized dark part appears in the center first, then expands from the center to outward. That is, the solid-liquid interface moves from the center to outward. In FIG. 5, showing the one-dimensional image of the predetermined area changing with time, the crystallization is observed to proceed downward in FIG. 5 as time passes. The center of a field is adjusted to inverse peak portion of the laser beam, that is, a portion where the phase of the KrF excimer laser light is changed by the phase shifter 24. In that portion, as the phases of the KrF excimer laser light are inverted on its both sides, the intensity of the excimer laser light significantly decreases (ideally to zero) due to the interference therebetween. Thus, the temperature of the film after melting is the lowest, and nucleation of the silicon film in the crystallization starts from this portion. Subsequently, crystal grains grow downward in FIG. 5 in accordance with the temperature gradient in the melt. The size of the crystal grains grown is about 6 µm, for example, crystallized in the PMELA apparatus of the present embodiment. Thus, the crystallization process can be observed as images with a spatial resolution of several µm and a temporal resolution of several nsec.

In FIG. 5, the example of the laser beam having one inverse peak has been described. However, in the actual crystallization process, the excimer laser light is adjusted to include a plurality of inverse peak having the light intensity distribution by the phase shift mask. An observation example of the crystallization process using the laser beam having a plurality of peaks is shown in FIGS. 6A, 6B and FIGS. 7A, 7B.

Figure 6A:
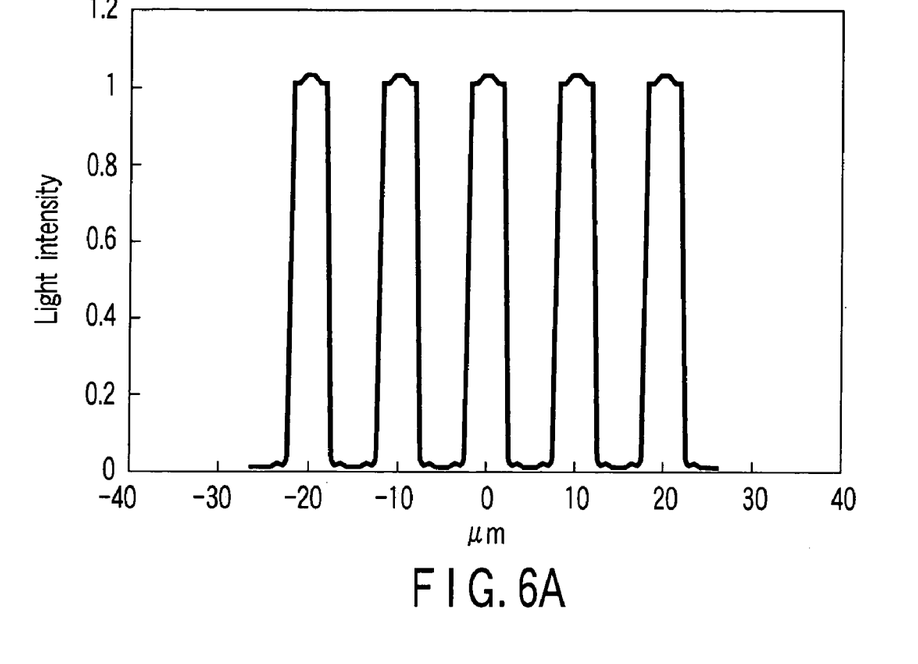
FIG. 6A shows a light intensity distribution of irradiated excimer laser light.
Figure 6B:
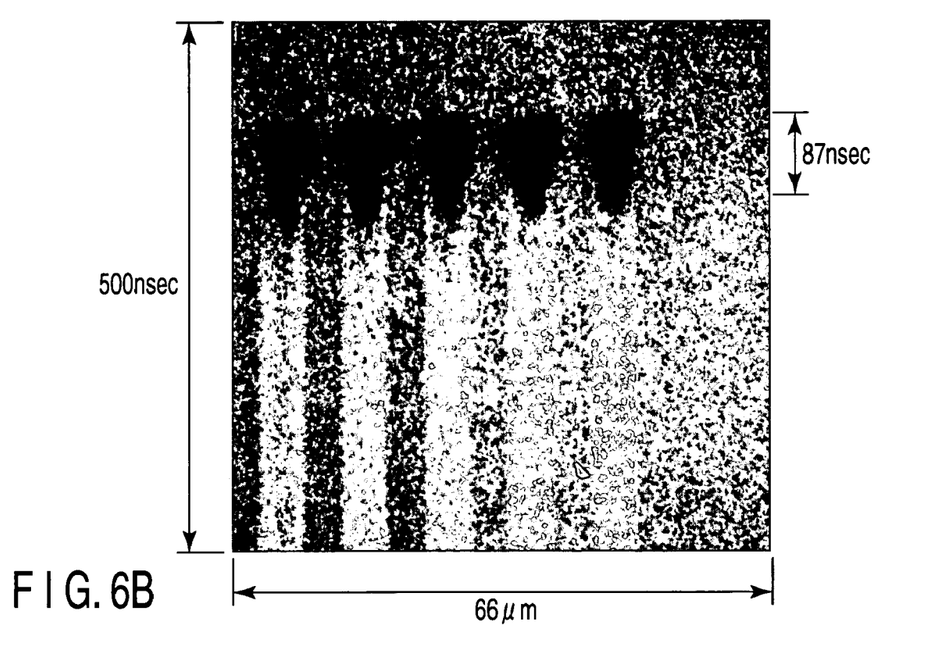
FIG. 6B shows a microscopic image showing the observation result of the crystallization process in a light irradiation area.

FIGS. 6A, 6B show an observation result of the crystallization process from the melting to crystallization in a area of several 10 µm and for a time period of several 100 nsec when a black-and-white mask is used to form the irradiation excimer laser light having a rectangular light intensity distribution with peak and valley. FIG. 6A shows the light intensity distribution of the excimer laser light wherein a horizontal axis indicates a position and a vertical axis indicates a relative intensity of the laser light, and FIG. 6B shows a microscopic image observed by means of the streak camera. As described above referring to FIG. 5, the image observed by streak camera is an image created by time scanning a one-dimensional image at the predetermined area on the semiconductor film changing with time. Here, FIG. 6B shows a negative image, and represents white and black inverted as compared with the above description on FIG. 5. That is, the melted part is displayed in black, while the crystallized part is displayed in white. The lateral width of the drawing is 66 µm, a vertical axis corresponds to time passed, an upper side of the drawing is a starting point of time, time passes downward, and the entire height corresponds to 500 nsec. The excimer laser light having a wavelength of 248 nm is irradiated to the amorphous silicon film having a thickness of 50 nm at an intensity of 0.42 J/cm$^2$ using a black-and-white mask with lines/spaces of 5 µm. It is to be noted that the optical system used is a 1/5-reduction type, and N. A. is 0.125. As shown in FIG. 6A, a peak-to-peak interval of the excimer laser light is 10 µm. In FIG. 6B, as described above, a black area is the melted area, a white area is the crystallized area, and a neutral color area is an amorphous area which has not been melted. Due to the irradiation of the laser light, the amorphous silicon film is melted around the peak portion of the light, but is not melted in a portion corresponding to the valley of the light. It has been observed that the crystallization starts and proceeds from both edges of the melted part with time, the solid-liquid interface moves to inward, and the crystallization is completed 87 nsec after the irradiation.

Figure 7A:
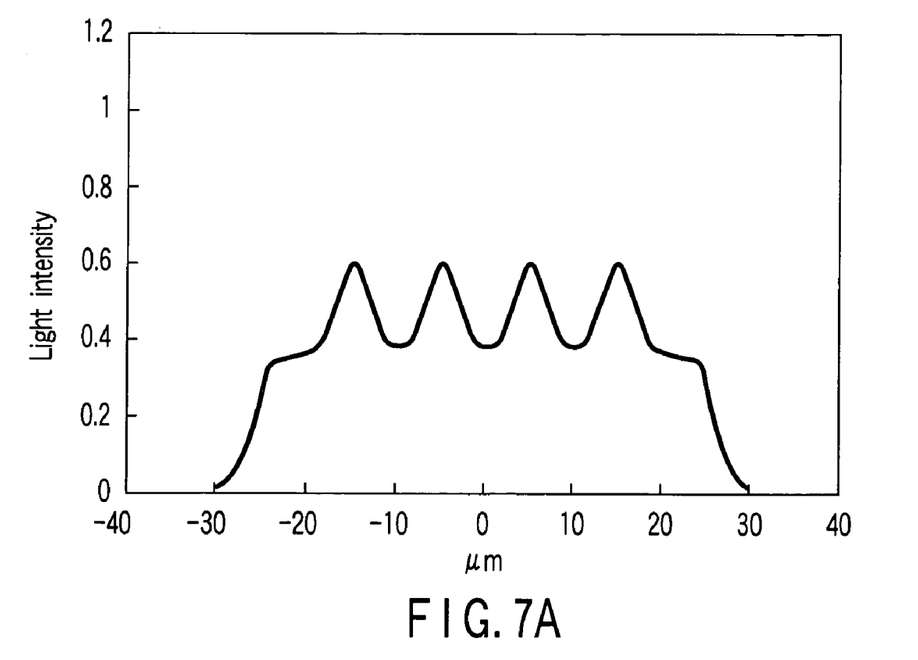
FIG. 7A shows a light intensity distribution of irradiated excimer laser light.
Figure 7B:
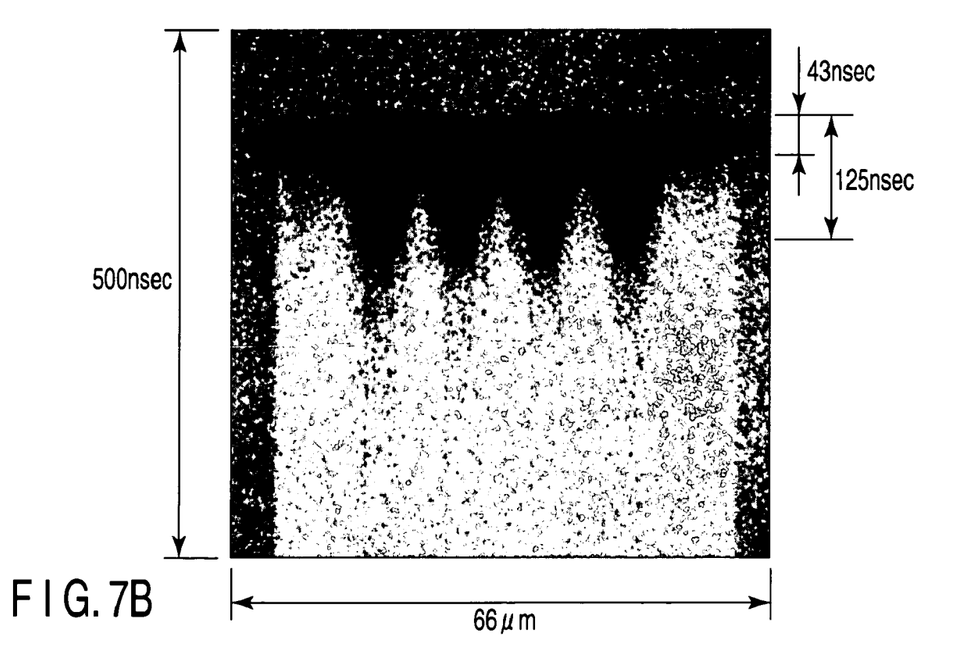
FIG. 7B shows a microscopic image showing the observation result of the crystallization process in a light irradiation area.

FIGS. 7A, 7B show another example when a phase-shift mask is used to implement the crystallization. Similar to FIGS. 6A, 6B, FIG. 7A shows the light intensity distribution of the excimer laser light, and FIG. 7B is an image showing the observation result of the crystallization process. Irradiation conditions are similar to those in FIG. 6 except that the intensity of the excimer laser light is 0.65 J/cm$^2$. As shown in FIG. 7A, by using the phase shift mask, a significant change can be made in the light intensity distribution of the excimer laser light, and peaks of the light intensity come up in parts corresponding to the valleys of the black-and-white mask. Moreover, even in the valleys of the light intensity, the light intensity is not too low, thus presenting a light intensity distribution with a relatively small intensity difference as a whole. When such excimer laser light having four peaks is irradiated to the amorphous silicon film, the whole irradiated area is melted, as shown in FIG. 7B. The crystallization starts 43 nsec after the light irradiation. The crystallization starts from parts corresponding to three valleys of the light intensity distribution, that is, from the part where the melting temperature is the lowest, as expected. Subsequently, the crystallization proceeds toward the peak of the light intensity, or the solid-liquid interface moves, and the crystallization is completed 125 nsec after the irradiation of the excimer laser light.

From the description above, the present invention enables to observe the ultra high-speed crystallization process of order of nsec from the melting to crystallization of the silicon film occurring in a time period of only 125 nsec after the light irradiation. Furthermore, it is confirmed that the crystallization of the silicon film can also be controlled by adjusting the intensity distribution of the irradiating light.

One example utilizing the result of observing the crystallization process includes focusing of the substrate 26 to an imaging plane of the imaging optical system 25. Defocusing, that is, a difference in height between an imaging plane of the excimer laser light and the semiconductor film on the substrate, is caused for several reasons as described later. When the imaging plane of the crystallization laser light (excimer laser light) is displaced from the semiconductor film on the substrate 26, the laser light intensity in the phase-inverted area is not made low as designed. Thus, the temperature after melting in that part is higher than that in the imaging position, so that the crystal nucleation delays, thus the beginning of the crystallization delays. Moreover, the crystal nucleus tends to be nucleated not only in the part where the intensity of the laser light is the lowest but also randomly in other parts. As a consequence, there are more chances that growing crystal grains meet each other, and the size of the crystal grains grown is smaller. That is, the quality of the crystallized silicon film is degraded.

The causes of defocusing in the crystallization apparatus in the crystallization process include, for example, insufficient flatness of the substrate 26, bending caused by holding the large-area substrate 26, and displacement of the imaging position due to the temperature change of the imaging optical system 25. The imaging optical system 25 changes (increases) its temperature by the irradiation of the high-energy excimer laser light. Thus, for example, when the temperature changes (increases) by 1° C. in the imaging optical systems 25, the imaging position changes by, for example, 10 µm. Taking into account a depth of focus of the imaging optical system 25, which is, for example, ±10 µm, the amount of the displacement in the imaging position is not negligibly small.

The displacement in the imaging position of the imaging optical system 25 can be observed in the following manner. T-T indicated in the center of FIG. 5 shows a time when a predetermined time $t_M$ has passed after the irradiation of the excimer laser light to the substrate 26 where the crystallization is in progress. A width W of the crystallized area (shaded portion) at that moment is measured by the image processing unit 45. The image processing unit 45 uses one of the known pattern recognition technique to compute an amount of displacement in accordance with image patterns of the crystallized silicon film. The computed amount of the displacement is used to decide whether it is below a predetermined acceptable defocusing amount or not, and then output it. If the image processing unit 45 decides that it is an unacceptable defocusing amount, it computes a correction amount for the position of the substrate 26. The stage driver 60 drives the substrate holding stage 27 on the basis of the position correction amount in the height direction of the substrate 26 computed by the image processing unit 45 as described above, thereby correcting the position in the height direction of the substrate 26.

As another application, a method of positioning the substrate 26 by utilizing the laser crystallization apparatus 1 of the present invention will be described. The crystallization method, in which the inverse peak light intensity distribution is formed by the phase shifter 24, can relatively easily determine the position to form the crystal grains. The photodetector 42 and the image intensifier 43 are temporarily removed from the optical path of the imaging optical system 41. Then, the imaging device 44 is moved to the imaging position of the microscopic imaging optical system 41 such that the substrate 26 can be positioned correctly in the following manner. For example, the substrate 26 is placed at a predetermined position on the X-Y-Z holding stage 27 with an alignment mark. After fine adjustment of the position with reference to the alignment mark, the crystallization process can be started. The crystallization process is displayed on the screen of the display unit 45c, and the position of the semiconductor film being crystallized can be confirmed from the display. When a displacement is detected, if the displacement exceeds an acceptable amount, then the image processing unit 45 can automatically detect the displacement from the alignment mark and make a correction. Further, the displacement correction may be automatically implemented for fine adjustment each time the crystallization laser light is irradiated. Still further, the result of the displacement correction based on the alignment mark can also be fed back to a resist exposure process to be executed later.

Next, the reason that the reflection type microscopic observation system is employed in the present embodiment will be described among various microscopic observation systems that can be used in the laser crystallization apparatus. Generally, the microscopic observation system includes a system using the reflected light by the substrate 26 and a system using transmitted light. In the microscopic observation system where the observation light is condensed directly by a microscope objective lens, the microscope objective lens has to be disposed in proximity to the substrate 26 in both the reflection type and the transmission type. A certain size is required for the microscope objective lens. It poses a problem that even in a reflection method in which the observation illumination light is applied obliquely to the substrate 26 from the same side as that of the crystallization laser light is irradiated, it is difficult to dispose the microscope objective lens in the space between the laser crystallization optical system 25 and the substrate 26 without blocking the optical path of the crystallization laser light, as also described later. In a method of applying the observation light obliquely from the rear side, there also are problems, for example, that the reflected light by the rear surface of the substrate 26, for example, the glass substrate, will become noise, and that focusing performed by oblique transmission through the glass substrate is difficult.

The following advantages are found in the reflection type observation illumination optical system 3 which adopts the reflection annular optical element 3A having a window hole in order not to block the optical path of the crystallization laser light and which illuminates with the observation light coaxial with the crystallization laser light. For example, the advantages include a small loss in the observation light due to the absence of absorption by the lens, no chromatic aberration, and imaging enabled without using a microscope objective lens. Therefore, the reflection type microscopic observation system using the reflection type observation illumination optical system 3 is preferable as the microscopic observation system of the laser crystallization apparatus 1, as compared with a microscopic observation system in which the observation light obliquely enters and in which the above-described observation light is directly condensed by the microscope objective lens.

A transmission microscopic observation system which adopts the similar annular optical element 3A to irradiate the observation illumination light coaxially from the same side as that of the crystallization laser light and in which the microscope objective lens is disposed on the rear side is suitable in respect of an optical arrangement, similarly to the above-described reflection type microscopic observation system using the reflection type observation illumination optical system 3. However, there are some restrictions to the system that the substrate 26 has limitations, for example, being made of a material which transmits the visible light, the window hole to pass the observation light has to be provided in the substrate holding stage 27 holding the substrate 26, and the rear part of the stage 27 can not be used for other purposes.

Furthermore, the semiconductor film (e.g., the amorphous silicon film, the polycrystal silicon film) on the substrate 26 to be processed becomes metallic when melted, and the reflectance of the visible light will be high. On the other hand, an unmelted silicon film and a crystallized silicon thin film transmit the red visible light significantly well, so that the reflectance will be low. In this respect, the method of using the reflected light for observation is suitable for observation with high contrast of how the silicon thin film is melted and crystallized.

The microscopic observation optical system 4 described in the present embodiment can have not only the configuration described above, but also a configuration part of which is omitted as described below or other configurations.

In one modification, the image intensifier 43 can be omitted, when the streak tube 42 includes the accelerating electrode 42d or the electron multiplier 42e and the intensity of a primary image which is an output of the streak tube 42 is sufficient for the sensitivity of the CCD imaging device 44, or when the sensitivity of the CCD imaging device 44 is sufficiently high.

In another modification, a so-called gated CCD imaging device 44 can be used which has a configuration where the streak tube 42 is omitted and where the image intensifier 43 and the CCD imaging device 44 are integrated. The gated CCD imaging device 44 applies a high voltage to the photoelectron multiplier 42e only at a predetermined moment in order to record a two-dimensional image on the fluorescent screen at that moment, thereby obtaining a two-dimensional image data by the CCD imaging device 44. Therefore, sequential data in a predetermined area can not be obtained in contrast to the case where the streak tube 42 is used. However, the high voltage applied to the photoelectron multiplier 42e can be controlled with a high temporal resolution of the order of several nsec, so that it can be obtained a two-dimensional image in a wide observation area at a predetermined moment.

The present invention is not limited to the above-described embodiments, and modifications can be made. Further, part of which can be omitted in use.

For example, the mechanism to correct the displacement of the substrate of the laser crystallization apparatus 1 can be omitted in order to provide a system simply to observe the changes in the semiconductor film that is melted and crystallized with time, without feeding back the observation results to the laser crystallization apparatus 1.

As described above, according to the present invention, it is possible to observe or measure, through images, the melting and crystallization of the semiconductor film with a high spatial resolution of several μm and with a high temporal resolution of order of nsec in real time or immediately after the crystallization. Further, for example, by feeding back in accordance with the observation result, the laser crystallization apparatus and crystallization method can be provided wherein the crystallization process is stabilized and crystallization can be implemented efficiently to produce a high-quality semiconductor film.

The present invention is not limited to the above-described embodiments, and various modifications can be made in an implementation phase without departing from the spirit thereof. Further, the above-described embodiments include various phases, and various kinds of inventions can be extracted with a proper combination of a plurality of constitutional requirements disclosed. For example, some constitutional requirements may be deleted from all the constitutional requirements indicated in the embodiments.

The above description of the embodiments disclosed herein has been given such that any person skilled in the art can create and use the present invention. Various modifications of these embodiments can be easily achieved by the person skilled in the art.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A laser crystallization apparatus comprising a crystallization optical system to irradiate a laser light to a thin film provided on a substrate and to melt and crystallize the thin film, wherein the laser light is a pulse laser light with an inverse peak light intensity distribution, the laser crystallization apparatus comprising:

an illumination light source disposed out of an optical path of the laser light and emitting an illumination light for observation to illuminate the thin film;

an illumination optical system comprising an annular optical element which has the optical path of the laser light in the center and which leads the illumination light from the illumination light source to the thin film along the optical path; and an observation optical system which displays in a magnified image at an area of the substrate including the thin film where the laser light is irradiated, at least one image of the thin film in a melting state and in a lateral crystallization process caused by a temperature distribution corresponding to the inverse peak light intensity distribution after stopping the laser light irradiation.

2. The laser crystallization apparatus according to claim 1, wherein the annular optical element comprises an annular plane mirror which is provided on the optical path of the laser light and which reflects and leads the illumination light from the illumination light source to the thin film.

3. The laser crystallization apparatus according to claim 1, wherein the annular optical element comprises an annular concave mirror or an annular convex mirror which is provided on the optical path of the laser light and which reflects and leads the illumination light from the illumination light source to the thin film.

4. The laser crystallization apparatus according to claim 1, wherein the laser light is an excimer laser light, and wherein the crystallization optical system comprises a phase modulating element which phase-modulates the incident excimer laser light to a light having a predetermined light intensity distribution, wherein the laser light which has passed through the phase modulating element irradiates the thin film.

5. The laser crystallization apparatus according to claim 4, wherein the observation optical system comprises:

a microscopic optical system comprising the annular optical element which magnifies and images at least one image of melting or crystallizing state of the laser irradiated area in the thin film provided on the substrate or at least one image of the melting or crystallizing state which is changing; and an imaging device which picks up the image of the thin film expanded by the microscopic optical system.

6. The laser crystallization apparatus according to claim 4, wherein the observation optical system comprises:

a microscopic optical system comprising the annular optical element which magnifies and images on a photoelectric surface at least one image of melting or crystallizing state of the laser irradiated area in the thin film provided on the substrate or at least one image of the melting or crystallizing state which is changing;

a photodetector which multiplies electrons produced in the photoelectric surface and leads the electrons on a fluorescent screen to form a fluorescent image; and an imaging device which picks up the fluorescent image of the photodetector.

7. The laser crystallization apparatus according to claim 1, wherein the observation optical system comprises:

a microscopic optical system comprising the annular optical element which magnifies and images at least one image of melting or crystallizing state of the laser irradiated area in the thin film provided on the substrate or at least one image of the melting or crystallizing state which is changing; and an imaging device which picks up the image of the thin film expanded by the microscopic optical system.

8. The laser crystallization apparatus according to claim 7, wherein the photodetector is a streak tube.

9. The laser crystallization apparatus according to claim 7, wherein the imaging device is a cooled CCD imaging device.

10. The laser crystallization apparatus according to claim 1, wherein the observation optical system comprises:

a microscopic optical system comprising the annular optical element which magnifies and images on a photoelectric surface at least one image of melting or crystallizing state of the laser irradiated area in the thin film provided on the substrate or at least one image of the melting or crystallizing state which is changing;

a photodetector which multiplies electrons produced in the photoelectric surface and leads the electrons to a fluorescent screen to form a fluorescent image; and an imaging device which picks up the fluorescent image of the photodetector.

11. The laser crystallization apparatus according to claim 10, wherein the photodetector is a streak tube.

12. The laser crystallization apparatus according to claim 1, further comprising:
an image processing unit which processes the image detected by the observation optical system;
a stage driver which has a function to adjust a position of the substrate in accordance with positional data on the substrate obtained by the image processing unit.

13. The laser crystallization apparatus according to claim 1, wherein the thin film is an amorphous silicon film or a polycrystal silicon film.

14. A laser crystallization apparatus comprising a crystallization optical system to irradiate a laser light to a thin film provided on a substrate and to melt and crystallize the thin film, wherein the laser light is a pulse laser light with an inverse peak light intensity distribution, the laser crystallization apparatus comprising:
an illumination light source disposed out of an optical path of the laser light and emitting an illumination light for observation to illuminate the thin film;
an illumination optical system comprising an annular optical element which has the optical path of the laser light in the center and which leads the illumination light from the illumination light source to the thin film along the optical path; and
an observation optical system which displays in a magnified image at an area of the substrate including the thin film where the laser light is irradiated, at least one image of the thin film in a melting state and in a lateral crystallization process caused by a temperature distribution corresponding to the inverse peak light intensity distribution after stopping the laser light irradiation,
wherein the annular optical element comprises an annular plane mirror and an annular concave mirror or an annular convex mirror respectively provided on the optical path of the laser light, the annular plane mirror reflects and leads the illumination light from the illumination light source to the annular concave mirror or annular convex mirror, and the annular concave mirror or annular convex mirror reflects and leads the illumination light reflected by the annular plane mirror to the thin film.

15. The laser crystallization apparatus according to claim 14, wherein the illumination optical system comprises one or more lenses or half mirrors disposed out of the optical path, and the lens or half mirror leads the illumination light from the illumination light source to the thin film via the annular optical element.

16. The laser crystallization apparatus according to claim 15, wherein the observation optical system comprises:
a microscopic optical system comprising the annular optical element which magnifies and images at least one image of melting or crystallizing state of the laser irradiated area in the thin film provided on the substrate or at least one image of the melting or crystallizing state which is changing; and
an imaging device which picks up the image of the thin film expanded by the microscopic optical system.

17. The laser crystallization apparatus according to claim 15, wherein the observation optical system comprises:
a microscopic optical system comprising the annular optical element which magnifies and images on a photoelectric surface at least one image of melting or crystallizing state of the laser irradiated area in the thin film provided on the substrate or at least one image of the melting or crystallizing state which is changing;
a photodetector which multiplies electrons produced in the photoelectric surface and leads the electrons on a fluorescent screen to form a fluorescent image; and
an imaging device which picks up the fluorescent image of the photodetector.

18. A laser crystallization method comprising:
emitting a laser light;
irradiating the laser light through a hole of a reflection annular optical element to a thin film provided on a substrate to melt and crystallize the thin film;
illuminating a laser irradiated area with an observation illumination light along an optical path of the laser light without interfering with each other by illuminating the annular optical element with the observation illumination light simultaneously with the irradiation of the laser light;
magnifying and imaging the reflected observation illumination light from the thin film as at least one image of melting or crystallizing state in the thin film; and
picking up the magnified image.

19. The laser crystallization method according to claim 18, wherein the illumination of the observation illumination light to the thin film is implemented during the irradiation of the laser light to thin film or after the irradiation of the laser light to the thin film.

20. The laser crystallization method according to claim 18, wherein the step of picking up the image further comprises:
taking the magnified image as an image data, wherein the magnified image is at least one image of melting or crystallizing state in the thin film or at least one image of the melting or crystallizing state which is changing;
processing the image data of the thin film;
computing positional data on the substrate in accordance with a result of the image processing; and
adjusting a position of the substrate in accordance with the positional data.

21. The laser crystallization method according to claim 18, wherein the substrate is a glass substrate, and the thin film is an amorphous silicon film or a polycrystal silicon film formed on the glass substrate.

* * * * *